United States Patent
Ker et al.

(10) Patent No.: US 6,894,324 B2
(45) Date of Patent: May 17, 2005

(54) SILICON-ON-INSULATOR DIODES AND ESD PROTECTION CIRCUITS

(75) Inventors: Ming-Dou Ker, Hsin-Chu (TW); Kei-Kang Hung, Changhua (TW); Tien-Hao Tang, Hsin-Chu (TW)

(73) Assignee: United Microelectronics Corp. (TW)

( * ) Notice: Subject to any disclaimer, the term of this patent is extended or adjusted under 35 U.S.C. 154(b) by 853 days.

(21) Appl. No.: 09/783,870

(22) Filed: Feb. 15, 2001

(65) Prior Publication Data

US 2002/0109153 A1 Aug. 15, 2002

(51) Int. Cl.[7] .............................................. H01L 31/072
(52) U.S. Cl. ...................... 257/199; 257/212; 257/603; 257/551; 257/347; 257/349; 257/327; 257/504; 257/584; 257/586; 257/438; 257/311
(58) Field of Search ................................ 257/199, 212, 257/603, 551, 347, 349; 327/504, 584, 586; 438/311

(56) References Cited

U.S. PATENT DOCUMENTS

| | | | | |
|---|---|---|---|---|
| 4,989,057 A | * | 1/1991 | Lu ............................. | 357/23.7 |
| 5,426,062 A | * | 6/1995 | Hwang ........................ | 437/21 |
| 5,923,067 A | * | 7/1999 | Voldman .................... | 257/349 |
| 6,015,993 A | * | 1/2000 | Voldman et al. ............ | 257/355 |
| 6,429,482 B1 | * | 8/2002 | Culp et al. .................. | 257/345 |

FOREIGN PATENT DOCUMENTS

JP          11074538 A  *  3/1999

* cited by examiner

Primary Examiner—Nathan J. Flynn
Assistant Examiner—Remmon R. Fordé

(57) ABSTRACT

A silicon-on-insulator (SOI) gated diode and non-gated junction diode are provided. The SOI gated diode has a PN junction at the middle region under the gate, and which has more junction area than a normal diode. The SOI non-gated junction diode has a PN junction at the middle region thereof, and then also has more junction area than a normal diode. The SOI diodes of the present invention improve the protection level offered for electrical overstress (EOS)/electrostatic discharge (ESD) due to the low power density and heating for providing more junction area than normal ones. The I/O ESD protection circuits, which comprise primary diodes, a first plurality of diodes, and a second plurality of diodes, all of which are formed of the present SOI diodes, could effectively discharge the current when there is an ESD event. And, the ESD protection circuits, which comprise more primary diodes, could effectively reduce the parasitic input capacitance, so that they can be used in the RF circuits or HF circuits. The proposed gated diode and non-gated diode can be fully process-compatiable to general partially depleted or fully-depleted silicon-on-insulator CMOS processes.

5 Claims, 7 Drawing Sheets

SILICON-ON-INSULATOR DIODES AND ESD PROTECTION CIRCUITS

BACKGROUND OF THE INVENTION

1. Field of the Invention

The present invention relates to diodes in silicon-on-insulator (SOI) CMOS process, and more particularly to ESD protection circuits with the diodes in silicon-on-insulatorCMOS process.

2. Description of the Prior Art

Silicon-on-insulator technology is a prime contender for low voltage, high speed applications because of its advantages over bulk-Si technology in reduced process complexity, latch-up immunity and smaller junction capacitance. However, electrostatic discharge (ESD) is a major reliability concern for SOI technology.

The protection level provided by an ESD protection device is determined by the amount of current that it can sink. The device failure is initiated by thermal runaway and followed by catastrophic damage during an ESD pulse. In SOI devices, the presence of the buried oxide layer having a thermal conductivity $1/100^{th}$ of Si causes increased device's heating, which in turn accelerates thermal runaway.

FIG. 1 depicts a cross-sectional view of a prior SOI diode, called as Lubistor diode, published in the article of the Proc. Of EOS/ESD Symp., 1996, pp. 291–301. If the silicon layer above the buried oxide layer 100 is doped N type dopant, the junction of the SOI diode is P+ 102/N well 101. The two terminals of this junction diode are V1 connected to P+ 102 and V2 connected to N well 101. If V1 is positive relative to V2, the SOI diode is under forward biased. However, if V1 is negative relative to V2, the diode is under reverse biased. If the P+ 102/N well 101 (or N+/P well) junction area in which the power is generated during an ESD event is smaller, then it will increase power density and heat. The heat is generated in a localized region at the P-N junction and the dominant component of the heat at the junction is Joule heat. Second breakdown is assumed to occur when the maximum temperature in the SOI diode reaches the intrinsic temperature ($T_{intrinsic}$). In order to get better ESD protection level, one should reduce the power density and Joule heat.

Accordingly, it is a desirability to provide a diode with lower power density in silicon-on-insulator CMOS process for ESD protection.

SUMMARY OF THE INVENTION

It is one object of the present invention to provide a silicon-on-insulator diode with more junction area than a normal one, thereby a lower power density and heating are obtained, and the protection level offered for electrical overstress (EOS)/electrostatic discharge (ESD) is improved.

It is another object of the present invention to provide a silicon-on-insulator diode with more junction area than a normal one, which could be used in the I/O ESD protection circuit and the Vdd-to-Vss ESD protection circuit under forward biased condition.

It is a further object of the present invention to provide an I/O ESD protection circuit having SOI diodes with more junction area than normal ones, which can reduce the parasitic input capacitance, and could serve as the I/O ESD protection circuit in the RF circuits or HF circuits.

In order to achieve the above objects, the present invention provides a silicon-on-insulator diode and ESD protection circuit thereof. The silicon-on-insulator diode comprises a substrate, an insulating layer, two shallow trench isolations, and a PN junction diode formed of a first well with a first conductive type having either of N type and P type and a second well with a second conductive type opposite to the first conductive type. The insulating layer is formed on the substrate and then the two shallow trench isolations are formed thereon. The PN junction diode is formed between the two shallow trench isolations. While, the ESD protection circuit having the SOI diodes comprises an electrically conductive pad, a conductor segment, a first voltage supply rail, a second voltage supply rail, a first diode, a second diode, a first plurality of diodes and a second plurality of diodes. All of which are fabricated on the insulating layer. The conductor segment connects the pad directly to a first node. The first diode connects between the first node and the first voltage supply rail, and the second diode connects between the first diode and the second voltage supply rail. The first plurality of diodes connect between the first node and the first voltage supply rail, and which are opposite to the first diode's direction. The second plurality of diodes connect between the first node and the second voltage supply rail, and which are opposite to the second diode's direction.

BRIEF DESCRIPTION OF THE DRAWINGS

The foregoing and other advantages and features of the invention will be apparent from the following more particular description of preferred embodiments of the invention, as illustrated in the accompanying drawings.

DESCRIPTION OF THE PREFERRED EMBODIMENTS

Figure 2:
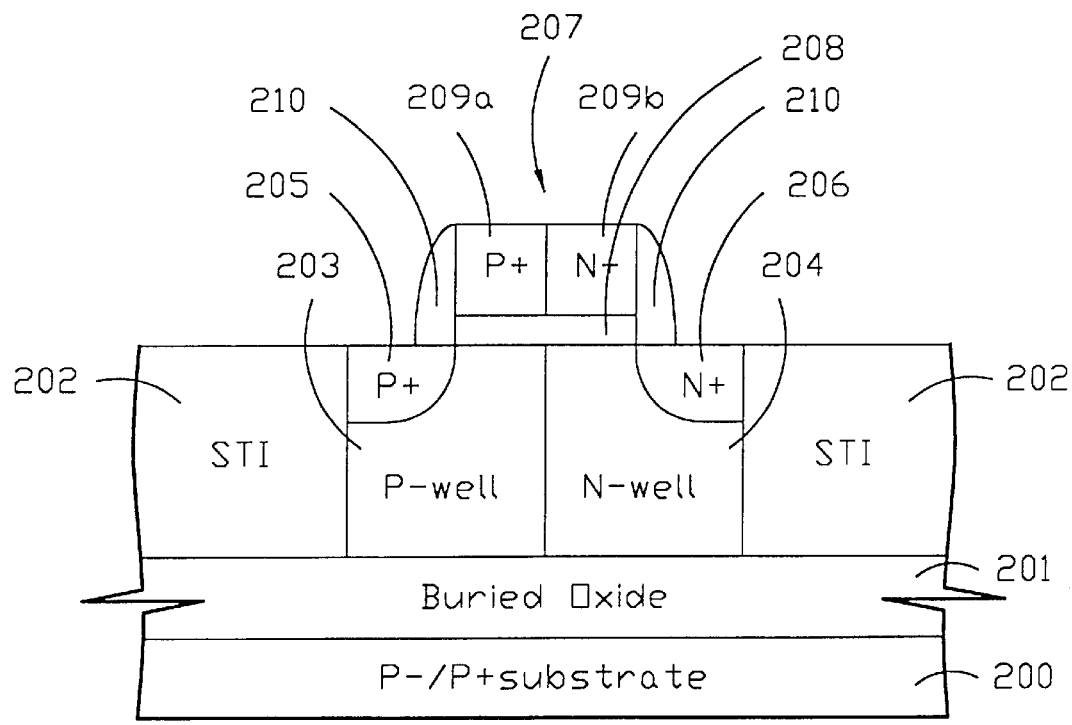
FIG. 2 is a cross-sectional view of a diode with the junction at the middle region under the gate according to the present invention.

FIG. 2 is a cross-sectional view of a gated diode according to the present invention. The structure of FIG. 2 comprises a substrate 200, for example, a P− substrate or P+ substrate, and an insulating layer 201, such as, a buried silicon dioxide layer, formed thereon. Two shallow trench isolations 202 are formed on the insulating layer 201, and a P well 203 based on a silicon layer and an N 204 based on a silicon layer are formed on the insulating layer 201 between the two shallow trench isolations 202. The P well 203 and the N well 204 constitute a PN junction. A first highly doped P+ diffusion region 205 is formed at the upper corner of the P well 203 adjacent to the one shallow trench isolation 202, and a second highly doped N+ diffusion region 206 is formed at the upper corner of N well 204 adjacent to the other shallow trench isolation 202. A MOS-like gate 207 is formed on the P well 203 and the N well 204, and the junction of the P well 203 and the N well 204 is at the middle region under the MOS-like gate 207. The MOS-like gate 207 comprises a dielectric layer 208, a polysilicon gate formed on the dielectric layer 208, consisting of a third highly doped P+ diffusion gate region 209a and a fourth highly doped N+ diffusion gate region 209b, and a dielectric spacer 210 formed on each side of the MOS-like gate 207. The third highly doped P+ diffusion region 209a and the fourth highly doped N+ diffusion region 209b are connected together electrically by a conductor layer (not shown in the figure) formed on the polysilicon gate, preferably a silicide layer. Besides, the first highly doped P+ diffusion region 205 and the second highly doped N+ diffusion region 206 are respectively self-aligned with the third highly doped P+ diffusion region 209a and the fourth highly doped N+ diffusion region 209b.

Figure 1:
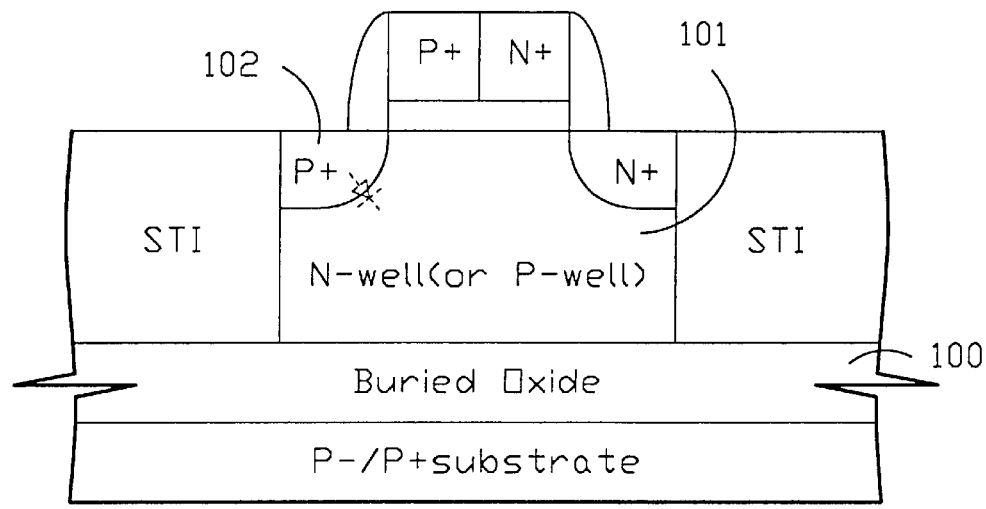
FIG. 1 is a cross-sectional view of the structure of a prior SOI polysilicon-bounded diode called as Lubistor diode.

The SOI diode is formed by the P well 203 and the N well 204, and the PN junction of the SOI diode is at the middle region under the MOS-like gate 207. Since the present diode with the P well 203/N well 204 junction has more junction area than the normal Lubistor diode with P+/N well or N+/P well in FIG. 1, the ESD protection level are raised by the present diode due to the low power density and heating.

Figure 3:
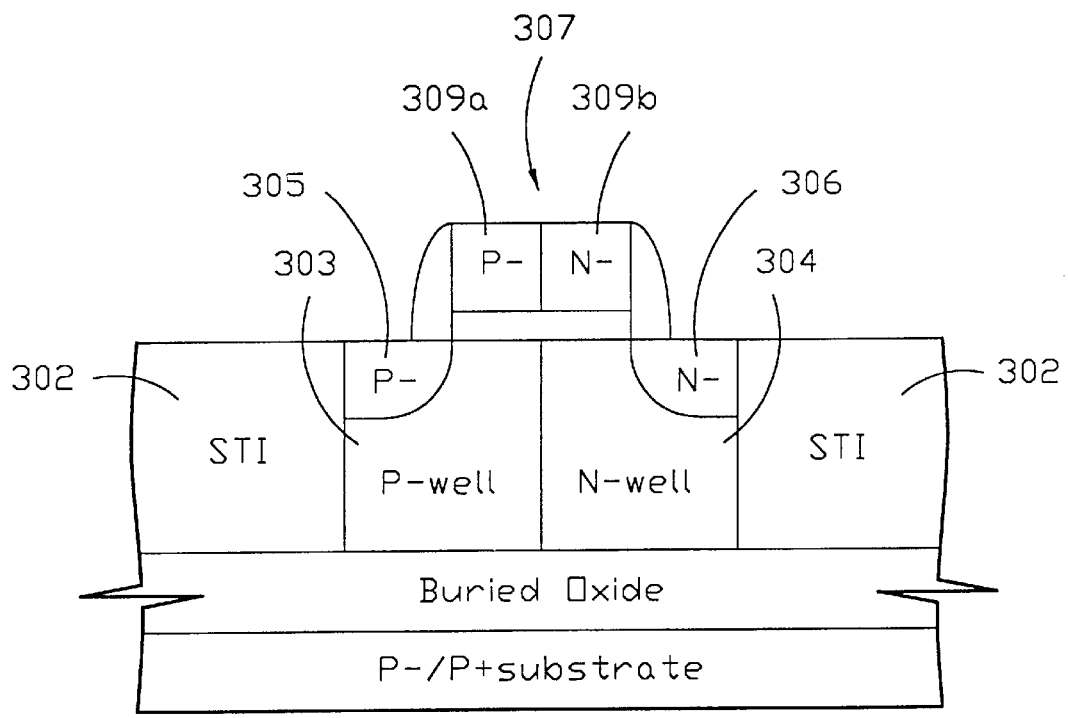
FIG. 3 is a cross-sectional view of another diode structure with the junction at the middle region under the gate according to the present invention.

FIG. 3 is a cross-sectional view of an alternate embodiment that is a variation of FIG. 2. A first lightly doped P− diffusion region 305 is formed at the upper corner of the P well 303 adjacent to one shallow trench isolation 302, and a second lightly doped N− diffusion region 306 is formed at the upper corner of the N well 304 adjacent to the other shallow trench isolation 302. The MOS-like polysilicon gate 307 comprises a third lightly doped P− diffusion gate region 309a and a fourth lightly doped N− diffusion gate region 309b. The third lightly doped P− diffusion region 309a and the fourth lightly doped N− diffusion region 309b are connected together electrically with a conductor layer (not shown in the figure) formed on the MOS-like polysilicon gate 307, preferably a silicide layer.

The SOI diode is also formed by the P well 303 and the N well 304. The PN junction of the diode is at the middle region under the MOS-like polysilicon gate 307.

Figure 4:
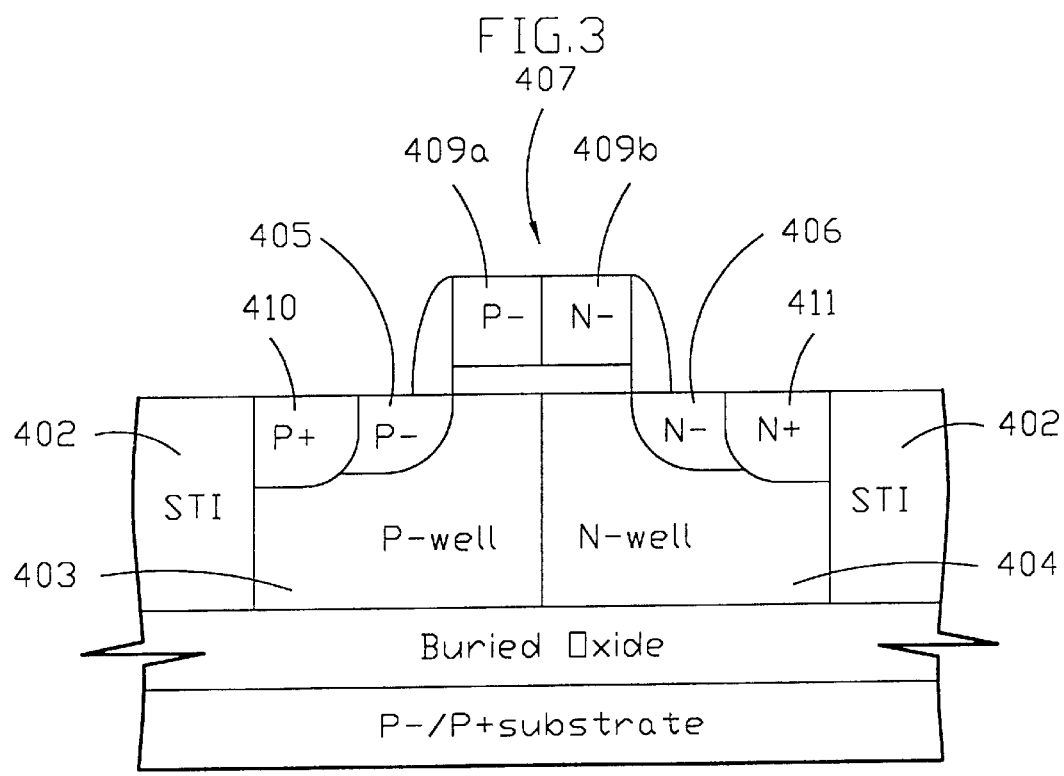
FIG. 4 is a cross-sectional view of another diode structure on a SOI wafer with integrated source/drain implants and the junction is at the middle region under the gate.

FIG. 4 is a cross-sectional view of an alternate embodiment that is a variation of FIG. 3. In this alternate embodiment, a fifth highly doped P+ diffusion region 410 is formed at the upper corner of the P well 403 between one shallow trench isolation 402 and the first lightly doped P− diffusion region 405, and a sixth highly doped N+ diffusion region 411 is formed at the upper corner of the N well 404 between the other shallow trench isolation 402 and the second lightly doped N− diffusion region 406. The MOS-like polysilicon gate 407 comprises a third lightly doped P− diffusion region 409a and a fourth lightly doped N− diffusion region 409b. The third lightly doped P− diffusion gate region 409a and the fourth lightly doped N− diffusion gate region 409b are connected together electrically by a conductor layer (not shown in the figure) formed on the MOS-like polysilicon gate 407, preferably a silicide layer.

The SOI diode is formed by the P well 403 and the N well 404. The PN junction of the diode is at the middle region under the MOS-like polysilicon gate 407.

Figure 5:
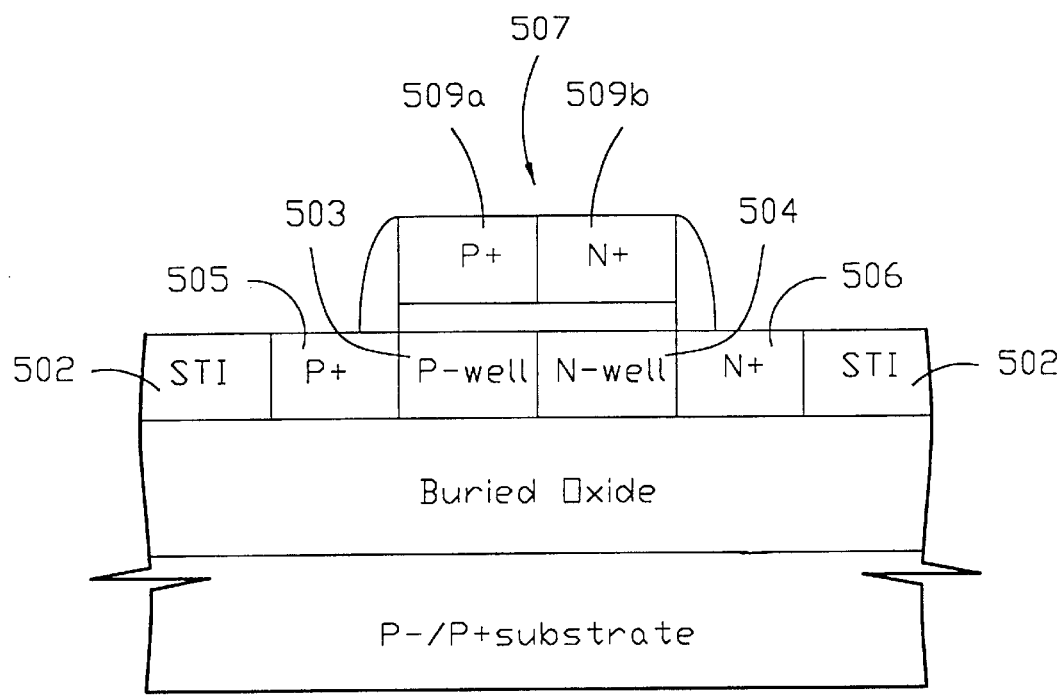
FIG. 5 is a cross-sectional view of the structure of a gated diode in the fully-depleted SOI CMOS process.

FIG. 5 is a cross-sectional view of an alternate embodiment that is a variation of FIG. 2. The silicon thickness in this silicon-on-insulator (SOI) structure is fully depleted by a first highly doped P+ diffusion region 505 and a second highly doped N+ diffusion region 506. The SOI diode is also formed by the P well 503 and the N well 504, and the PN junction of the diode is at the middle region under the MOS-like polysilicon gate 507.

Figure 6:
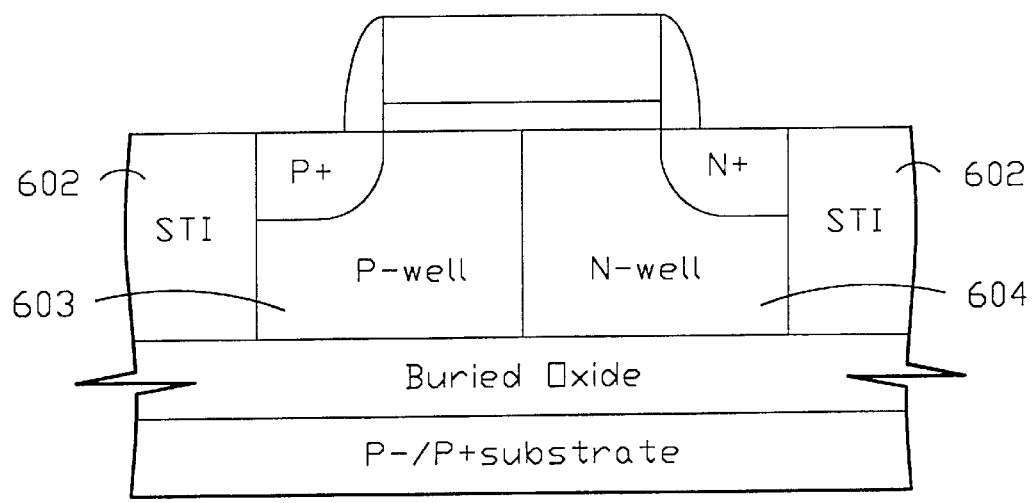
FIG. 6 is a cross-sectional view of a gated diode with the junction at the middle region under the gate.

FIG. 6 is a cross-sectional view of an alternate embodiment that is a variation of FIG. 2. In this alternate embodiment, there is no diode in the MOS-like polysilicon gate 607. However, the MOS-like polysilicon gate 607 can be a highly doped or lightly doped P type diffusion region or N type diffusion region. The SOI diode is also formed by the P well 603 and the N well 604, and the PN junction of the diode is at the middle region under the MOS-like polysilicon gate 607.

Figure 7:
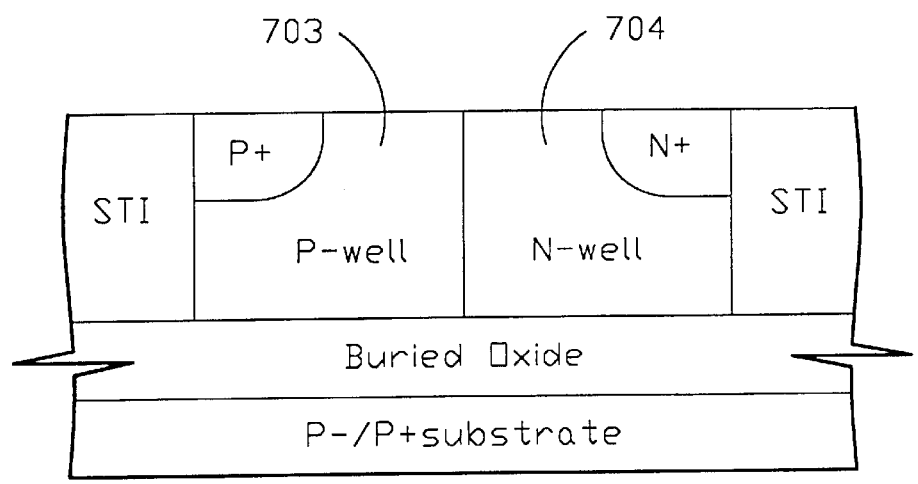
FIG. 7 is a cross-sectional view of a non-gated junction diode with the junction at the middle region.

FIG. 7 is a cross-sectional view of an alternate embodiment that is a variation of FIG. 2. In this embodiment, there is no gate structure and named as non-gated junction diode. The SOI diode is also formed by the P well 703 and the N well 704.

Figure 8:
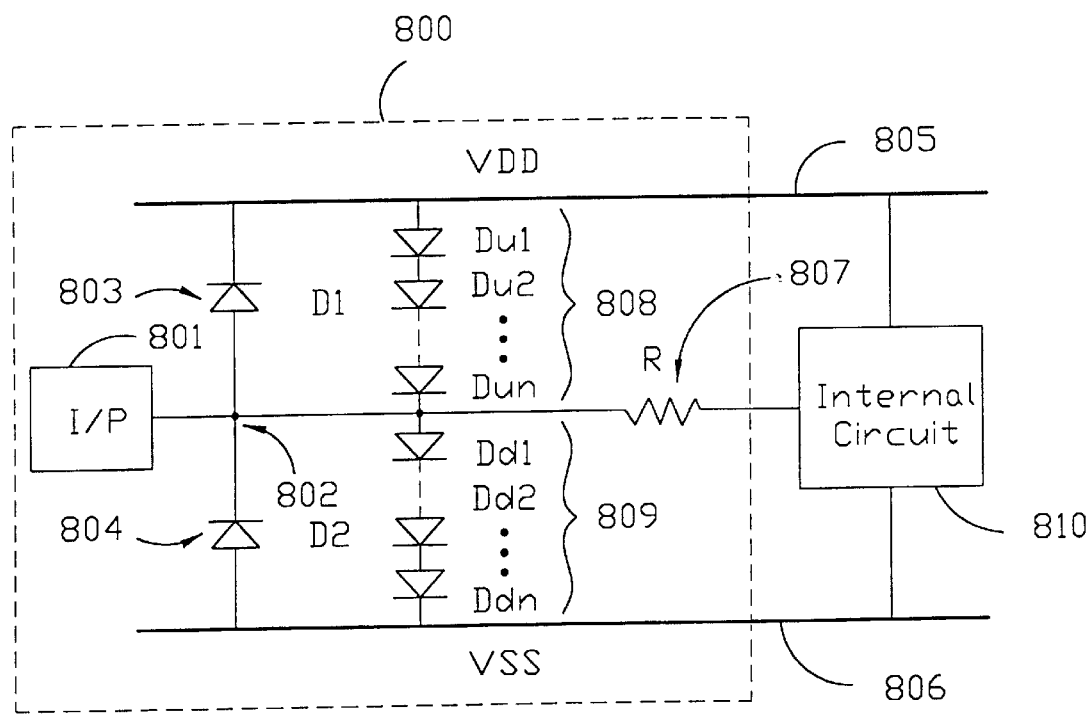
FIG. 8 and FIG. 9 are schematic diagrams of SOI ESD protection circuits for I/O pins in accordance with alternative embodiments of FIG. 2 to FIG. 7 of the present invention.

FIG. 8 is one embodiment of an SOI ESD protection circuit comprising SOI diodes in accordance with the alternative embodiments of FIG. 2 to FIG. 7. The ESD protection circuit 800 comprises an electrically conductive input pad 801, two primary diodes D1 803 and D2 804, a Vdd voltage supply rail 805, a Vss voltage supply rail 806, an input resistor 807, a first plurality of diodes (Du1 to Dun) 808 connected in series and a second plurality of diodes (Dd1 to Ddn) 809 connected in series. All of these diodes are formed by the SOI diodes in accordance with the alternative embodiments of FIG. 2 to FIG. 7. And, the input pad 801, the Vdd voltage supply rail 805, the Vss voltage supply rail 806, and the input resistor 807 are fabricated on the insulating layer the same with the SOI diodes.

The input pad 801 is directly connected to a first node 802 through a conductor segment. The primary diode D1 803 is connected between the first node 802 and the Vdd voltage supply rail 805, and the primary diode D2 804 is connected between the first node 802 and the Vss voltage supply rail 806. The first plurality of diodes (Du1 to Dun) 808 are connected between the first node 802 and the Vdd voltage supply rail 805, and these diodes' direction is opposite to the primary diode D1 803. The second plurality of diodes (Dd1 to Ddn) are connected between the first node 802 and the Vss voltage supply rail 806, and these diodes' direction is opposite to the primary diode D2 804. The input resistor 807 is connected between the first node 802 and a portion of the internal circuit 810 to be protected by the ESD protection circuit 800. While, the input resistor 807 can also be coupled to an input buffer of the internal circuit 810, and then a second node is located between the input resistor 807 and the input buffer.

When the ESD event involves the application of a positive voltage to the input pad 801 relative to the Vdd voltage supply rail 805, the primary diode D1 803 is forward biased and the primary diode D2 804 is not active because the Vss voltage supply rail 806 is floating. As a result, the associated ESD current is discharged to the Vdd voltage supply rail 805 through the primary diode D1 803.

Similarly, when the ESD protection event involves the application of a negative voltage to the input pad 801 relative to the Vss voltage supply rail 806, the primary diode D2 804 is forward biased and the primary diode D1 803 is not active because the Vdd voltage supply rail 805 is floating. The ESD event is discharged to the Vss voltage supply rail 806 through the primary diode D2 804.

When the ESD event involves the application of a voltage to the input pad 801, which is negative with respect to the Vdd voltage supply rail 805, the primary diode D1 803 is reversed. At this condition, the Vss voltage supply rail 806 is floating. The first plurality of diodes (Du1 to Dun) 808 is forward biased under this ESD zapping condition, therefore the ESD current is discharged through the first plurality of diodes (Du1 to Dun).

When the ESD event involves the application of a voltage to the input pad 801 which is positive with respect to the Vss voltage supply rail 806. The primary diode D2 804 is reverse biased. At this condition, the Vdd voltage supply rail 805 is floating. The secondary plurality of diodes (Dd1 to Ddn) 809 is forward biased under this ESD zapping condition, therefore, the ESD current is discharged through the secondary plurality of diodes (Dp1 to Dpn).

Figure 9:
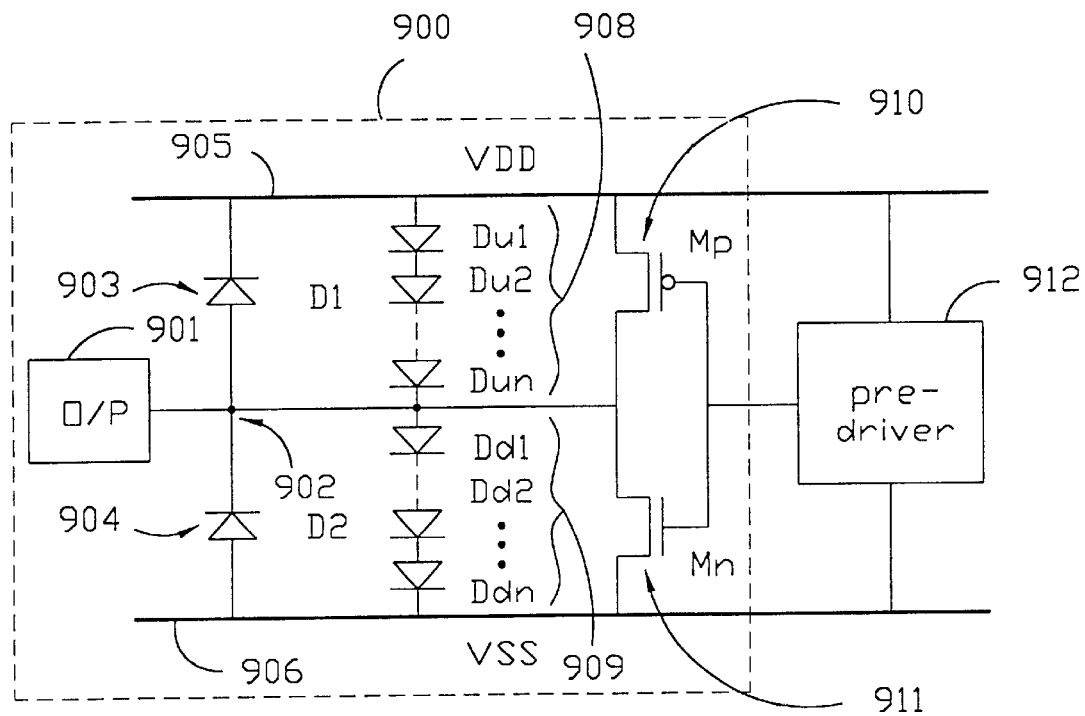

FIG. 9 is another embodiment of an SOI ESD protection circuit comprising the SOI diodes in accordance with the alternative embodiments of FIG. 2 to FIG. 7. The ESD protection circuit 900 comprises an electrically conductive output pad 901, primary diodes D1 903 and D2 904, a Vdd voltage supply rail 905, a Vss voltage supply rail 906, a first plurality of diodes (Du1 to Dun) 908 connected in series, and a second plurality of diodes (Dd1 to Ddn) 909 connected in series. All of these diodes are formed of the SOI diodes in accordance with the alternative embodiments of FIG. 2 to FIG. 7. And, the output pad 901, the Vdd voltage supply rail 905, and the Vss voltage supply rail 906 are fabricated on the insulating layer the same with the SOI diodes.

The output pad 901 is directly connected to a node 902 by a conductor segment. The primary diode D1 903 is connected between the node 902 and the Vdd voltage supply rail 905, and the primary diode D2 904 is connected between the node 902 and the Vss voltage supply rail 906. The first plurality of diodes (Du1 to Dun) 908 are connected between the node 902 and the Vdd voltage supply rail 905, and these diodes' direction is opposite to the primary diode D1 903. The second plurality of diodes (Dd1 to Ddn) 909 are connected between the node 902 and the Vss voltage supply rail 906, and these diodes' direction is opposite to the primary diode D2 904. The node 902 is connected to the output terminal of an output buffer formed of a P-channel transistor 910 and an N-channel transistor 911. And, the input terminal of the output buffer is connected to a pre-driver 912.

When the ESD event involves the application of a positive voltage to the output pad 901 relative to the Vdd voltage supply rail 905, the primary diode D1 903 is forward biased and the primary diode D2 904 is not active because the Vss voltage supply rail 906 is floating. As a result, the associated ESD current is discharged to the Vdd voltage supply rail 905 through the primary diode D1 903.

Similarly, when the ESD event involves the application of a negative voltage to the output pad 901 relative to the Vss voltage supply rail 906, the primary diode D2 904 is forward biased and the primary diode D1 903 is not active because the Vdd voltage supply rail 905 is floating. The ESD event is discharged to the Vss voltage supply rail 906 through the primary diode D2 904.

When the ESD event involves the application of a voltage to the output pad 901, which is negative with respect to the Vdd voltage supply rail 905, the primary diode D1 903 is reverse biased. The Vss voltage supply rail 906 is floating under this condition. The first plurality of diodes (Du1 to Dun) 908 is forward biased under this ESD-zapping condition, therefore the ESD current is discharged through the first plurality of diodes (Du1 to Dun). When the ESD event involves the application of a voltage to the output pad 901 which is positive with respect to the Vss voltage supply rail 906, the primary diode D2 904 is reverse biased. The Vdd voltage supply rail 905 is floating during this ESD event. The secondary plurality of diodes (Dd1 to Ddn) 909 is forward biased under this ESD-zaping condition, therefore, the ESD current is discharged through the secondary plurality of diodes (Dd1 to Ddn) 909.

Figure 10:
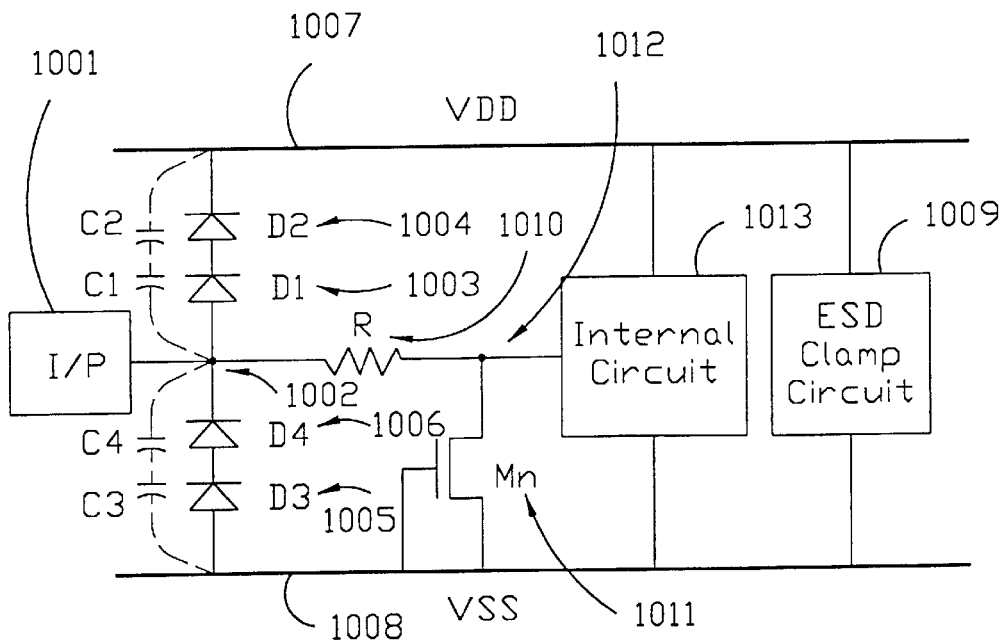
FIG. 10 and FIG. 11 are schematic diagrams of SOI ESD protection circuits in accordance with alternative embodiments of FIG. 2 to FIG. 7 of the present invention.

FIG. 10 is further another embodiment of an SOI ESD protection circuit comprising the SOI diodes in accordance with the alternative embodiments of FIG. 2 to FIG. 7. The ESD protection circuit comprises an electrically conductive input pad 1001, primary diodes D1 1003, D2 1004, D3 1005 and D4 1006, an input resistor 1010, an n-channel transistor 1011, a Vdd voltage supply rail 1007, a Vss voltage supply rail 1008 and an ESD clamp circuit 1009. The primary diodes D1 1003 and D2 1004 are connected in series, and the primary diodes D3 1005 and D4 1006 are connected in series. All of these diodes are formed by the SOI diodes in accordance with the alternative embodiments of FIG. 2 to FIG. 7. And, the input pad 1001, the input resistor 1010, the Vdd voltage supply rail 1007, and the Vss voltage supply rail 1008 are fabricated on the insulating layer the same with the SOI diodes.

The input pad 1001 is directly connected to a first node 1002 through a conductor segment. The primary diodes D1 1003 and D2 1004 are connected between the first node 1002 and the Vdd voltage supply rail 1007. The primary diodes D3 1005 and D4 1006 are connected between the first node 1002 and the Vss voltage supply rail 1008. The input resistor 1010 and the n channel transistor 1011 are coupled in series between the input pad 1001 and the Vss voltage supply rail 1008. And, the input resistor 1010, the n channel transistor 1011 and the internal circuit 1013 are coupled through a second node 1012. The gate and source of the n channel transistor 1011 are coupled to the Vss voltage supply rail 1008. The ESD clamp circuit 1009 is connected between the Vdd voltage supply rail 1007 and the Vss voltage supply rail 1008.

Two primary diodes D1 1003 and D2 1004 are connected between the input pad 1001 and the Vdd voltage supply rail 1007 instead of one diode D1 in FIG. 8, and other two diodes D3 1005 and D4 1006 are connected between the input pad 1001 and the Vss voltage supply rail 1008 instead of one diode D2 in FIG. 8. If diode D1's parasitic junction capacitance is C1, diode D2's parasitic junction capacitance is C2, diode D3's parasitic junction capacitance is C3, and diode D'4 parasitic junction capacitance is C4. The input capacitance is Cin=C1+C2 in FIG. 8, but in this embodiment, the input capacitance becomes Cin'=[C1C2/(C1+C2)]+[C3C4/(C3+C4)]. If the diodes (D1, D2, D3, D4) are identity, that means C1=C2=C3=C4=C, then Cin=2C in FIG. 8 and Cin'=C in FIG. 10. Therefore, the parasitic input capacitance of this embodiment is reduced, and then the RC time constant is also reduced. By the lowering of the input delay, the ESD protection circuit of this embodiment could be applied in RF circuits or in HF circuits.

Figure 11:
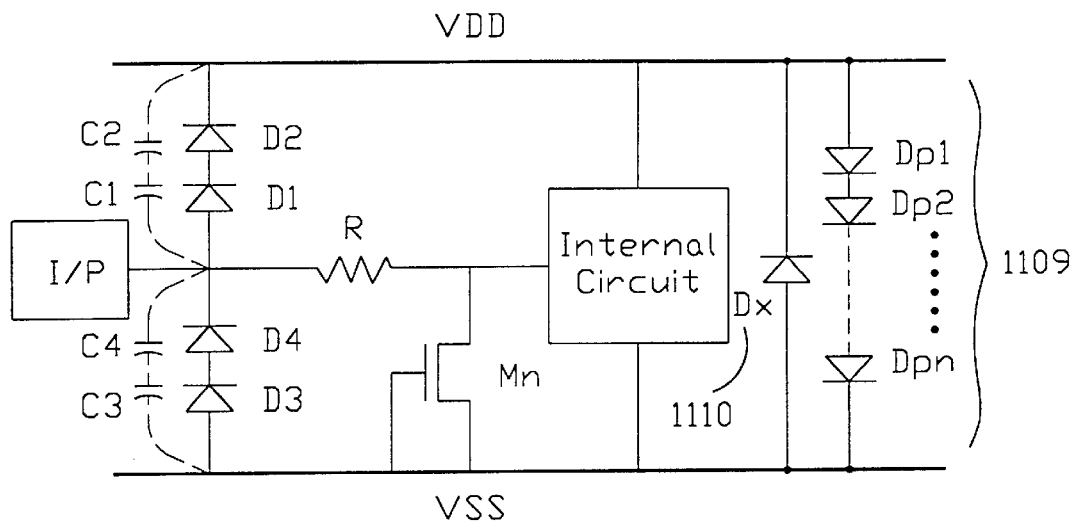

FIG. 11 is an alternative of FIG. 10. The Vdd-to-Vss ESD clamping circuit comprises a plurality of first SOI diodes (Dp1 to Dpn) 1109 and a second SOI diode 1110 connected in parallel between the Vdd voltage supply rail and the Vss voltage supply rail. And, all the diodes used in this ESD protection circuit are in accordance with the alternative embodiments of FIG. 2 to FIG. 7.

Figure 12:
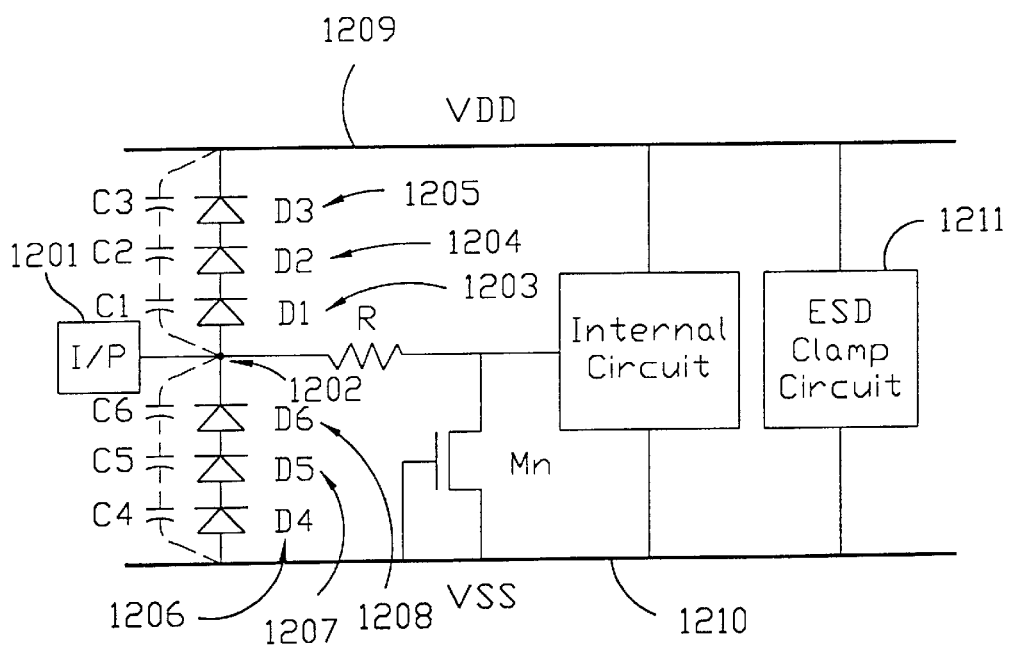
FIG. 12 and FIG. 13 respectively are variations of FIG. 10 and FIG. 11.

FIG. 12 is a variation of FIG. 10. In this ESD protection circuit, there are three diodes D1 1203, D2 1204, and D3 1205 in series between the Vdd voltage supply rail 1209 and the input pad 1201, and three diodes D4 1206, D5 1207, and D6 1208 in series between the Vss voltage supply rail 1210 and the input pad 1201. All of the diodes used in this ESD protection circuit are in accordance with the alternative embodiments of FIG. 2 to FIG. 7. The input capacitance becomes Cin'=[C1C2C3/(C1C2+C2C3+C1C3)]+[C4C5C6/(C4C5+C5C6+C4C6)]=2/3 C, which further to be reduced.

Figure 13:
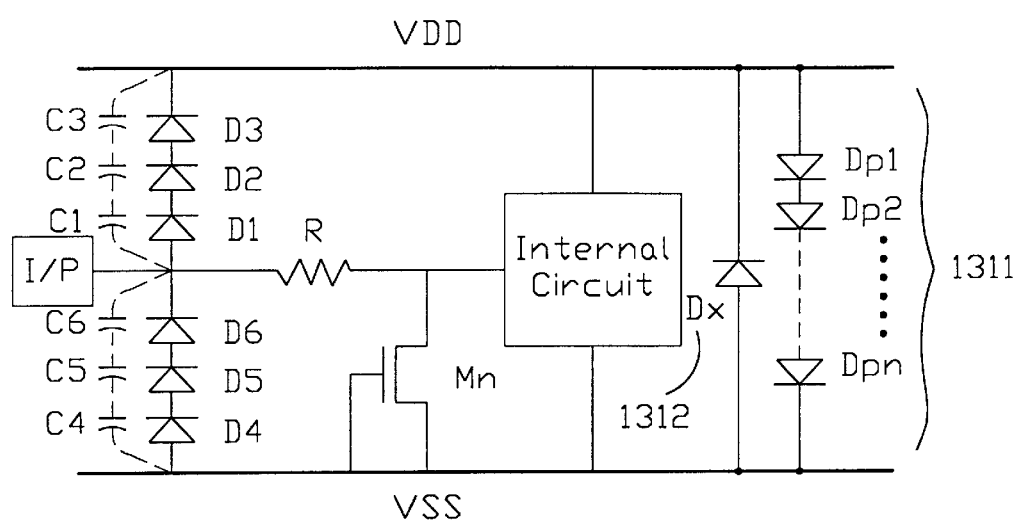

FIG. 13 is an alternative of FIG. 12. The Vdd-to-Vss ESD clamping circuit comprises a plurality of first SOI diodes (Dp1 to Dpn) 1311 and a second SOI diode 1312 connected in parallel between the Vdd voltgae supply rail and the Vss voltage supply rail. And, all the diodes used in this ESD protection circuit are in accordance with the alternative embodiments of FIG. 2 to FIG. 7.

According to the foregoing, the present invention provides advantages as follows:

1. The present invention provides a SOI diode with low power density due to increasing the PN junction area.
2. The present invention provides a SOI diode with improved ESD protection level.
3. The present invention provides a SOI diode could be used in mixed-voltage and analog/digital circuits. The present SOI diodes also could serve as the I/O ESD protection circuit, and the Vdd-to-Vss protection circuit under forward biased condition.
4. The present invention provides an ESD protection circuit with the reduced input capacitance, and could serve as the I/O ESD protection circuit in the RF circuits or HF circuits.

The preferred embodiments are only used to illustrate the present invention, not intended to limit the scope thereof. Many modifications of the preferred embodiments can be made without departing from the spirit of the present invention.

What is claimed is:

1. A silicon-on-insulator (SOI) diode, comprising:
   a substrate;
   an insulating layer formed on said substrate;
   two shallow trench isolations formed on said insulating layer; and
   a PN junction diode formed of a first well with a first conductive type having either of N type and P type and a second well with a second conductive type opposite to said first conductive type adjacent thereto, both of which formed between said two shallow trench isolations on said insulating layer, said first well having a first highly doped diffusion region with said first conductive type formed at the upper corner thereof adjacent to one said shallow trench isolation, and said second well having a second highly doped diffusion region with said second conductive type formed at the upper corner thereof adjacent to the other said shallow trench isolation.

2. The SOI diode of claim 1, wherein said insulating layer is formed of a silicon dioxide layer.

3. The SOI diode of claim 1, wherein a MOS-like gate is formed above said first well and said second well, said MOS-like gate comprising a dielectric layer and a conducting layer formed thereon and two dielectric spacers formed respectively along each side of said MOS-like gate, wherein said first highly doped diffusion region and said second highly doped diffusion region are respectively self-aligned said each side of said MOS-like gate.

4. The SOI diode of claim 3, wherein said conducting layer of said MOS-like gate comprises a third highly doped diffusion region and a fourth highly doped diffusion region, said third highly doped diffusion region being electrically shorted to said fourth highly doped diffusion region, and said first highly doped diffusion region and said second highly doped diffusion region respectively self-aligned said third highly doped diffusion region and said fourth highly doped diffusion region.

5. The SOI diode of claim 3, wherein both of said first highly doped diffusion region and said second highly doped diffusion region are formed on said insulating layer, and respectively between said one shallow trench isolation and said first well and between the other said shallow trench isolation and said second well.

* * * * *